(12) United States Patent
Griffith

(10) Patent No.: US 9,778,041 B2
(45) Date of Patent: Oct. 3, 2017

(54) RATIOMETRIC NUCLEAR MAGNETIC RESONANCE (NMR) GYROSCOPE SYSTEM

(71) Applicant: Robert C. Griffith, Woodland Hills, CA (US)

(72) Inventor: Robert C. Griffith, Woodland Hills, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 462 days.

(21) Appl. No.: 14/593,827

(22) Filed: Jan. 9, 2015

(65) Prior Publication Data

US 2016/0202062 A1  Jul. 14, 2016

(51) Int. Cl.
  G01C 19/62  (2006.01)
  G01R 33/26  (2006.01)

(52) U.S. Cl.
  CPC ............ G01C 19/62 (2013.01); G01R 33/26 (2013.01)

(58) Field of Classification Search
  CPC ................................. G01C 19/62; G01R 33/26
  See application file for complete search history.

(56) References Cited

U.S. PATENT DOCUMENTS

| | | | |
|---|---|---|---|
| 4,157,495 A | 6/1979 | Grover et al. | |
| 2011/0025330 A1* | 2/2011 | Bulatowicz | G01C 19/62 324/318 |
| 2012/0191396 A1* | 7/2012 | Griffith | G01C 19/62 702/92 |
| 2014/0159718 A1* | 6/2014 | Larsen | G01R 33/24 324/301 |
| 2014/0184216 A1* | 7/2014 | Walker | G01R 33/26 324/305 |
| 2016/0202062 A1* | 7/2016 | Griffith | G01C 19/62 324/304 |

FOREIGN PATENT DOCUMENTS

| | | |
|---|---|---|
| JP | 2014-504729 | 2/2014 |
| WO | 2012/099819 A1 | 7/2012 |
| WO | WO 2012/106094 A1 | 8/2012 |

OTHER PUBLICATIONS

European Search Report for corresponding EP 16 15 0518, completed Jun. 3, 2016.
Office Action dated Feb. 1, 2017 from corresponding JP 2016-002435.

* cited by examiner

*Primary Examiner* — G. M. Hyder
(74) *Attorney, Agent, or Firm* — Tarolli, Sundheim, Covell & Tummino LLP

(57) ABSTRACT

An NMR gyroscope system includes a vapor cell that includes an alkali metal, a first gyromagnetic isotope, and a second gyromagnetic isotope, and a pump laser generates an optical pump beam. A magnetic field generator generates a magnetic field that is substantially aligned with a sensitive axis to cause the first and second gyromagnetic isotopes to counter-precess based on the optical pump beam and the alkali metal. A probe laser provides an optical probe beam through the vapor cell that exits the vapor cell as a detection beam, and a detection system monitors the detection beam and to determine a rotation of the NMR gyroscope system about a sensitive axis based on a modulation of the detection beam in response to precession of the first and second gyromagnetic isotopes and based on a predetermined constant ratio of precession of the first and second gyromagnetic isotopes.

20 Claims, 3 Drawing Sheets

RATIOMETRIC NUCLEAR MAGNETIC RESONANCE (NMR) GYROSCOPE SYSTEM

TECHNICAL FIELD

The present invention relates generally to sensor systems, and specifically to a ratiometric magnetic resonance (NMR) gyroscope system.

BACKGROUND

A typical nuclear magnetic resonance (NMR) gyroscope operates on the principle of sensing inertial angular rotation rate or orientation angle about a sensitive axis based on a shift in the measured Larmor precession frequency or phase of one or two isotopes that possess nuclear magnetic moments. An NMR gyroscope system can include a vapor cell and a rotation sensor that includes, for example, a light source, a photodetector, and signal processing circuitry. As an example, the vapor cell can contain one or more alkali metals, such as rubidium or cesium, together with one or more gyromagnetic isotopes that are caused to precess in response to a magnetic field. The signal processing circuitry can extract the Larmor precession frequency and/or phase information of the one or more gyromagnetic isotopes. As a result, a gyroscope rotation rate or orientation angle about the sensitive axis can be calculated based on the extracted Larmor precession frequencies and phase information.

SUMMARY

An NMR gyroscope system includes a vapor cell that includes an alkali metal, a first gyromagnetic isotope, and a second gyromagnetic isotope, and a pump laser generates an optical pump beam. A magnetic field generator generates a magnetic field that is substantially aligned with a sensitive axis to cause the first and second gyromagnetic isotopes to counter-precess based on the optical pump beam and the alkali metal. A probe laser provides an optical probe beam through the vapor cell that exits the vapor cell as a detection beam, and a detection system monitors the detection beam and to determine a rotation of the NMR gyroscope system about a sensitive axis based on a modulation of the detection beam in response to precession of the first and second gyromagnetic isotopes and based on a predetermined constant ratio of precession of the first and second gyromagnetic isotopes.

Another embodiment includes a method for measuring a rotation about a sensitive axis of an NMR gyroscope system. The method includes generating an optical pump beam via a pump laser and generating a magnetic field via a magnetic field generator. The method also includes providing the optical pump beam and the magnetic field through a vapor cell comprising an alkali metal, a first gyromagnetic isotope, and a second gyromagnetic isotope to cause the first and second gyromagnetic isotopes to counter-precess. The method also includes generating an optical probe beam via a probe laser and providing the optical probe beam through the vapor cell orthogonally with respect to the optical pump beam to provide a detection beam exiting the vapor cell. The method also includes demodulating the detection beam to determine a precession of the first and second gyromagnetic isotopes. The method also includes generating a reference frequency based on a predetermined ratio of the precession of the first and second gyromagnetic isotopes and phase-locking a frequency associated with the precession of the first and second gyromagnetic isotopes to the reference frequency. The method further includes determining a rotation about the sensitive axis based on the frequency of the precession of one of the first and second gyromagnetic isotopes based on the phase-locked frequency of the precession of the first and second gyromagnetic isotopes.

Another embodiment includes an NMR gyroscope system. The system includes a vapor cell comprising an alkali metal, a first gyromagnetic isotope, and a second gyromagnetic isotope and a pump laser configured to generate an optical pump beam. The system also includes a magnetic field generator configured to generate a magnetic field that is substantially aligned with a sensitive axis to cause the first and second gyromagnetic isotopes to counter-precess based on the optical pump beam and the alkali metal. The system further includes a probe laser configured to provide an optical probe beam through the vapor cell that exits the vapor cell as a detection beam and a detection system. The detection system includes a demodulation system configured to receive the detection beam and to determine a frequency corresponding to precession of the first gyromagnetic isotope in the vapor cell based on the magnetic field. The detection system also includes a precession reference counter configured to generate a reference frequency based on a clock signal and based on a predetermined constant ratio of precession of the first and second gyromagnetic isotopes. The detection system also includes a phase-locked loop configured to phase-lock a sum of precession frequencies of the first and second gyromagnetic isotopes with the reference frequency. The detection system further includes a rotation latch configured to determine a rotation of the NMR gyroscope system about the sensitive axis based on the frequency corresponding to precession of the first gyromagnetic isotope.

DETAILED DESCRIPTION

The present invention relates generally to sensor systems, and specifically to a ratiometric nuclear magnetic resonance (NMR) gyroscope system. The NMR gyroscope system can include a vapor cell having alkali metal, a first gyromagnetic isotope and a second gyromagnetic isotope. A magnetic field generator can generate a substantially uniform magnetic field that is provided through the vapor cell and which is aligned with a sensitive axis of the NMR gyroscope system. A pump laser can generate an optical pump beam that is provided through the vapor cell to spin-polarize the alkali metal, thus facilitating precession of the alkali metal and the gyromagnetic isotopes in response to the magnetic field. As an example, the pump laser can be configured to generate the optical pump beam as a linearly-polarized beam that is circularly-polarized via a quarter-wave plate before being provided through the vapor cell. A probe laser can generate an optical probe beam that can likewise be provided through the vapor cell in a direction that is orthogonal with respect to the optical pump beam, and which exits the vapor cell as a detection beam.

A detection system can be configured to monitor the detection beam to calculate a rotation of the NMR gyroscope system about the sensitive axis. For example, the detection system can be configured to monitor a Faraday rotation of the optical probe beam resulting from a precession of the gyromagnetic isotopes. The detection system can be configured to generate a reference frequency that can be based on a predetermined ratio between the precession of the first and second gyromagnetic isotopes and based on a clock signal. The clock signal can also be implemented to control a digital reference counter that can correspond to a frequency of the first gyromagnetic isotope precessing in free inertial space based on the magnetic field. Therefore, the detection system can include a phase-locked loop configured to phase-lock a sum of the frequencies of the first and second gyromagnetic isotopes with the reference frequency, such that a difference between the digital reference counter value and the frequency of the first gyromagnetic isotope can correspond to rotation of the NMR gyroscope system about the sensitive axis. Accordingly, the value of the digital reference counter can be latched based on the frequency of the first gyromagnetic isotope to provide a difference between the period of the digital reference counter and the frequency of the first gyromagnetic isotope, which thus corresponds to rotation of the NMR gyroscope system about the sensitive axis.

Figure 1:
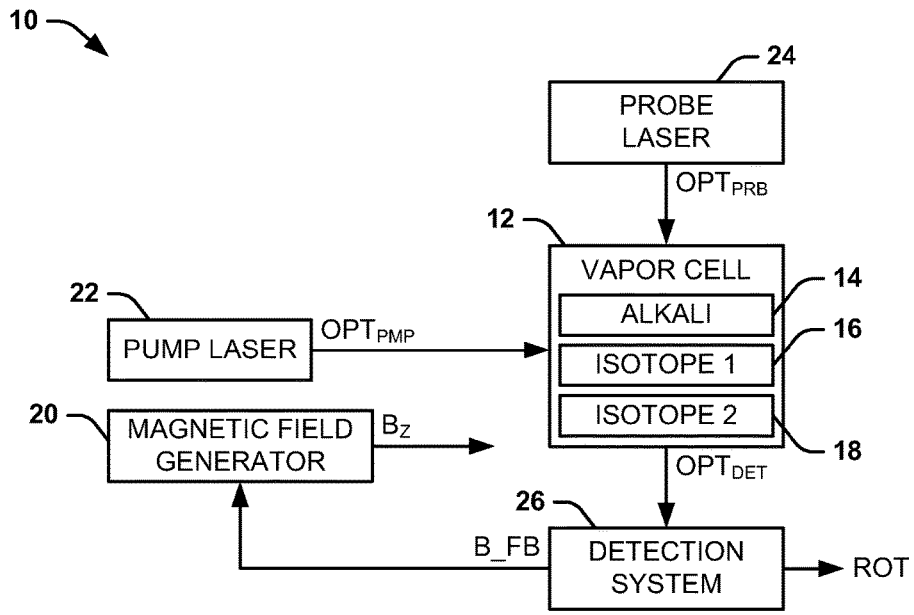
FIG. 1 illustrates an example of a nuclear magnetic resonance (NMR) gyroscope system.

FIG. 1 illustrates an example of a nuclear magnetic resonance (NMR) gyroscope system 10. The NMR gyroscope system 10 can be implemented in any of a variety of applications. As an example, the NMR gyroscope system 10 can be implemented in navigation systems for aircraft and/or spacecraft. In addition, the NMR gyroscope system 10 can be a portion of a multi-axis gyroscope system, such as demonstrated in greater detail in the example of FIG. 3.

The NMR gyroscope system 10 includes a vapor cell 12 that can be, for example, a glass casing of any of a variety of shapes and sizes. The vapor cell 12 includes an alkali metal 14, a first gyromagnetic isotope 16, and a second gyromagnetic isotope 18. As an example, the alkali metal 14 can be Rubidium (Rb) or Cesium (Cs) vapor. The gyromagnetic isotopes 16 and 18 can include any of a variety of noble gas isotopes, such as $^3$Helium, $^{83}$Krypton, $^{129}$Xenon, and/or $^{131}$Xenon. The NMR gyroscope system 10 also includes a magnetic field generator 20 that is configured to generate a net magnetic field $B_Z$ through the vapor cell 12. For example, the magnetic field $B_Z$ can include an AC modulated DC magnetic field, and thus an AC component and a DC component, that is provided through the vapor cell 12 and which is aligned with a sensitive axis of the NMR gyroscope system 10. As an example, the magnetic field generator 20 can be configured as a magnetic solenoid that substantially surrounds the vapor cell 12. In addition, the NMR gyroscope system 10 can include a magnetic shield (not shown) that can substantially surround the vapor cell 12, thus substantially mitigating interference from external magnetic fields, such as from the Earth magnetic field.

The NMR gyroscope system 10 also includes a pump laser 22 configured to generate an optical pump beam $OPT_{PMP}$. The optical pump beam $OPT_{PMP}$ is provided through the vapor cell 12, such as along the sensitive axis of the NMR gyroscope system 10 about which a rotation of the NMR gyroscope system 10 is determined. The optical pump beam $OPT_{PMP}$ can be generated at a wavelength that can be on-resonance with the alkali metal 14, such as corresponding to either a D1 or a D2 emission line associated with an alkali metal 14. As an example, the optical pump beam $OPT_{PMP}$ can be provided through the vapor cell 12 at a circular-polarization (e.g., via a quarter-wave plate). The circular-polarization of the optical pump beam $OPT_{PMP}$ can thus spin-polarize the alkali metal 14 based on an angular momentum of the photons therein to facilitate precession of the alkali metal 14 based on the magnetic field $B_Z$. The precession of the alkali metal 14 can thus facilitate precession of the gyromagnetic isotopes 16 and 18 via spin-exchange interaction between the gyromagnetic isotopes 16 and 18 and the alkali metal 14. For example, the gyromagnetic isotopes 16 and 18 (e.g., $^{131}$Xe and $^{129}$Xe) can be selected to counter-precess in response to the magnetic field $B_Z$, and thus precess in opposite directions, such that a sum of the precession of the gyromagnetic isotopes 16 and 18 is independent of the rotation of the NMR gyroscope system 10 about the sensitive axis, and is thus substantially constant at a substantially constant magnitude of the magnetic field $B_Z$.

The NMR gyroscope system 10 also includes a probe laser 24 configured to generate an optical probe beam $OPT_{PRB}$. As an example, the optical probe beam $OPT_{PRB}$ can be generated at a wavelength that is substantially off-resonance with the alkali metal 14. The optical probe beam $OPT_{PRB}$ is provided through the vapor cell 12, such as in a direction that is orthogonal with respect to the optical pump beam $OPT_{PMP}$, and exits the vapor cell 12 as a detection beam $OPT_{DET}$. The NMR gyroscope system 10 also includes a detection system 26 that is configured to monitor the detection beam $OPT_{DET}$ to determine a rotation of the NMR gyroscope system 10 about the sensitive axis. For example, the detection system 26 can be configured to determine the rotation angle of the NMR gyroscope system 10 about the sensitive axis based on the measured precession angle of one or both of the gyromagnetic isotopes 16 and 18. In the example of FIG. 1, the determined rotation of the NMR gyroscope system 10 is demonstrated as a signal ROT.

For example, the detection system 26 can be configured to determine the rotation angle ROT about the sensitive axis of the vapor cell 12 based on the precession frequencies of the gyromagnetic isotopes 16 and 18 that is indicated by the demodulated detection signal $OPT_{DET}$. As described herein, the precession frequencies of the gyromagnetic isotopes 16 and 18 can be phase-locked to a reference frequency that is generated based on a predetermined constant ratio of the precession frequencies of the first and second gyromagnetic isotopes 16 and 18. For example, the detection system 26 can be configured to provide the precession frequency of the first gyromagnetic isotope 16 as a first counter value that is indicative of the frequency of the first gyromagnetic isotope 16 in the vapor cell 12, and thus inclusive of the rotation ROT of the NMR gyroscope system 10 about the sensitive axis. The detection system 26 can also be configured to provide a second counter value that is indicative of the precession frequency of the first gyromagnetic isotope 16 in free inertial space based on a clock signal. Therefore, the phase-locking of the precession frequencies of the first and second gyromagnetic isotopes 16 and 18 can result in a determination of the rotation ROT of the NMR gyroscope system 10 about the sensitive axis based on a difference between the precession frequency of the first gyromagnetic isotope 16 in the vapor cell 12 and the precession frequency of the first gyromagnetic isotope 16 in free inertial space, as indicated by the first and second counter values. Accordingly, an associated processor can determine relative rotation (e.g., a rotation rate) of the NMR gyroscope system 10 based on consecutive samples of the difference between the first and second counter values.

Figure 2:
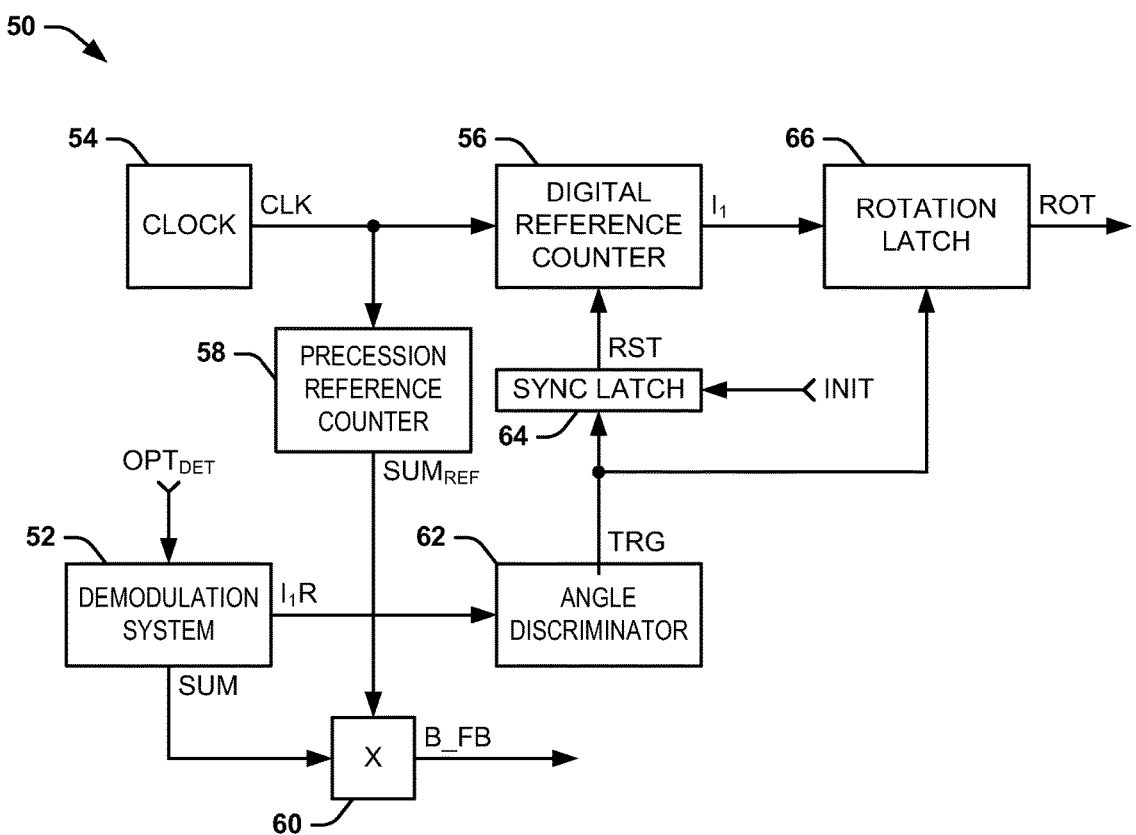
FIG. 2 illustrates an example of a detection system.

FIG. 2 illustrates an example of a detection system 50. The detection system 50 can correspond to the detection system 26 in the example of FIG. 1. Therefore, reference is to be made to the example of FIG. 1 in the following description of the example of FIG. 2. In the example of FIG. 2, the detection system 50 is configured to determine the rotation ROT of the NMR gyroscope system 10 based on an optical detection beam $OPT_{DET}$ that is provided from the vapor cell 12 that includes the alkali metal 14 and the first and second gyromagnetic isotopes 16 and 18.

The detection system 50 includes a demodulation system 52 that is configured to receive the optical detection beam $OPT_{DET}$ and to demodulate the optical detection beam $OPT_{DET}$ to ascertain a precession frequency of the first gyromagnetic isotope 16 and a precession frequency of the second gyromagnetic isotope 18. The demodulation system 52 can, for example, demodulate the optical detection beam $OPT_{DET}$ by removing a carrier signal corresponding to the precession of the alkali metal 14 to provide the precession frequencies of the first and second gyromagnetic isotopes 16 and 18. As an example, the optical detection beam $OPT_{DET}$ can have a Faraday rotation that can correspond to a combined modulation of the effects of the precession of the first and second gyromagnetic isotopes 16 and 18, such that the demodulation system 52 can be configured to demodulate the optical detection beam $OPT_{DET}$ (e.g., via a bandpass filter) to ascertain the precession frequency of each of the first and second gyromagnetic isotopes 16 and 18. The demodulation system 52 can provide a frequency signal SUM that corresponds to a sum of the precession frequencies of the first and second gyromagnetic isotopes 16 and 18. As described previously, the first and second gyromagnetic isotopes 16 and 18 can have been selected to counter-precess in the presence of the magnetic field $B_Z$ (e.g., the first and second gyromagnetic isotopes 16 and 18 can correspond to $^{131}$Xe and $^{129}$Xe). Therefore, the sum of the precession frequencies of the first and second gyromagnetic isotopes 16 and 18 can remain constant in response to rotation of the NMR gyroscope system 10 about the sensitive axis (e.g., in a constant magnitude of the magnetic field $B_Z$). In addition, the demodulation system 52 can be configured to provide a frequency signal $I_1R$ that corresponds to the precession frequency of the first gyromagnetic isotope 16 (e.g., $^{131}$Xe) in the vapor cell 12. Therefore, the frequency signal $I_1R$ includes a first frequency component associated with the precession of the first gyromagnetic isotope 16 in free inertial space (i.e., in the presence of the magnetic field $B_Z$), and includes a second frequency component associated with the rotation of the NMR gyroscope system 10 about the sensitive axis. The measurement of the precession frequency of the first gyromagnetic isotope 16 based on the optical detection beam $OPT_{DET}$ thus cannot isolate the first and second frequency components with respect to each other.

The detection system 50 also includes a clock 54, such as configured as a crystal clock, that generates a clock signal CLK. The clock signal CLK is provided to a digital reference counter 56 that is configured to implement a cyclical counter at a frequency corresponding to the first gyromagnetic isotope 16 in free inertial space (e.g., in the magnetic field $B_Z$) based on the clock signal CLK. The cyclical count value of the digital reference counter 56 is demonstrated in the example of FIG. 2 as a signal $I_1$. The clock signal CLK is also provided to a precession reference counter 58 that is configured to generate a reference frequency $SUM_{REF}$ that can correspond to a sum of the precession frequencies of the first and second gyromagnetic isotopes 16 and 18 in free inertial space in the presence of the magnetic field $B_Z$ based on the predetermined constant ratio of the precession frequencies of the first and second gyromagnetic isotopes 16 and 18. As described herein, the predetermined constant ratio of the precession frequencies of the first and second gyromagnetic isotopes 16 and 18 corresponds to a known ratio relationship between the Larmor precession frequencies of the first and second gyromagnetic isotopes 16 and 18 that is constant regardless of the magnitude of the magnetic field $B_Z$, and thus stable to greater than an accuracy that may be required for the NMR gyroscope system 10. As described herein, the predetermined constant ratio of the precession frequencies of the first and second gyromagnetic isotopes 16 and 18 can correspond to a ratio of the precession frequency of the first gyromagnetic isotope 16 and a sum (e.g., difference, depending on relative polarity of precession) of the precession frequencies of the first and second gyromagnetic isotopes 16 and 18. The accuracy of the Larmor frequency ratio of the first and second gyromagnetic isotopes 16 and 18 in a common magnetic field $B_Z$ allows the NMR gyroscope system 10 to achieve a very accurate determination of the rotation angle ROT about the sensitive axis based on the ratiometric mechanization described herein.

In the example described herein, the first gyromagnetic isotope 16 can correspond to $^{131}$Xe and the second gyromagnetic isotope 18 can correspond to $^{129}$Xe. In the following equations, a frequency $f_1$ can correspond to the Larmor precession frequency of the first gyromagnetic isotope 16 in free inertial space and a frequency $f_1m$ can correspond to the frequency $f_1$ minus the rotation of the NMR gyroscope system 10 about the sensitive axis. Thus, the frequency signal $I_1R$ corresponds to the frequency $f_1m$. Similarly, the frequency $f_2$ can correspond to the Larmor precession frequency of the second gyromagnetic isotope 18 in free inertial space and a frequency $f_2m$ can correspond to the frequency $f_2$ plus the rotation of the NMR gyroscope system 10 about the sensitive axis. To generate the reference frequency $SUM_{REF}$, the precession reference counter 58 can be configured to implement the predetermined constant ratio of the precession frequencies of the first and second gyromagnetic isotopes 16 and 18, such as expressed as:

$$f_1/(f_1+f_2)=f_1/SUM=0.22866 \qquad \text{Equation 1}$$

Wherein "SUM" is the frequency signal SUM and the solution is based on the first and second gyromagnetic isotopes 16 and 18 corresponding to $^{131}$Xe and $^{129}$Xe. The solution of Equation 1 can thus correspond to the predetermined constant ratio of the precession frequencies of the first and second gyromagnetic isotopes 16 and 18 that is implemented in the ratiometric implementation to determine the rotation of the NMR gyroscope system 10 about the sensitive axis. While the solution of Equation 1 is demonstrated as rounded to five places, it is to be understood that the ratio can be expressed at any resolution.

As described previously, the demodulation system 52 measures the precession frequencies of the first and second gyromagnetic isotopes 16 and 18 in the vapor cell 12, which includes the frequency of rotation of the NMR gyroscope system 10 about the sensitive axis. Therefore, the demodulation system 52 measures the frequencies $f_1m$ and $f_2m$. The demodulation system 52 or an associated processor can be configured to multiply the frequencies $f_1m$ and $f_2m$ to calculate a sum and a difference of the frequencies $f_1m$ and $f_2m$. The sum of the frequencies $f_1m$ and $f_2m$ can thus correspond to the frequency signal SUM that is provided by the demodulation system 52. The precession reference counter 58 can thus generate the reference frequency $SUM_{REF}$ as a sum of generated frequencies $f_1'$ and $f_2'$ that have the following ratio relationship:

$$f_1'/(f_1'+f_2')=f_1'/SUM_{REF}=0.22866 \qquad \text{Equation 2}$$

Wherein "$SUM_{REF}$" is the reference frequency $SUM_{REF}$. The frequencies $f_1'$ and $f_2'$ can be generated by the precession reference counter 58 based on the clock signal CLK. In the example described herein, the clock signal CLK has a frequency of approximately 6.0 MHz. However, it is to be understood that the clock signal CLK can have any frequency greater than or less than 6.0 MHz. As described previously, the cyclical count value $I_1$ that is generated by the digital reference counter 56 based on the clock signal CLK corresponds to the frequency to the first gyromagnetic isotope 16 in free inertial space, and therefore increments at the frequency $f_1'$.

As an example, the digital reference counter 56 and the precession reference counter 58 can be configured as cyclical counters having respective values that cycle through 36,000 counts (i.e., from 0 through 35,999, such that a reset occurs at the 0 count). The cyclical counter value can be selected based on a desired resolution of the NMR gyroscope system 10. In the example described herein, each increment of the digital reference counter 56 can thus correspond to 0.01° of rotation of the NMR gyroscope system 10 about the sensitive axis. To generate the frequency $f_1'$ that can correspond to the precession frequency of the first gyromagnetic isotope 16 in free inertial space based on the clock signal CLK, the frequency of the clock signal CLK is divided by the number of increments of the precession reference counter 58, as follows:

$$f_1'=CLK/36,000=(6*10^6)/36,000=166.66 \text{ Hz} \qquad \text{Equation 3}$$

Therefore, the frequency $f_1'$ can correspond to a frequency of a given one increment of the precession reference counter 58, and thus the frequency for each 0.01° of rotation of the NMR gyroscope system 10.

To generate the reference frequency $SUM_{REF}$ based on the predetermined constant ratio of the precession frequencies of the first and second gyromagnetic isotopes 16 and 18 and based on the clock signal CLK, the precession reference counter 58 can combine the frequency that is calculated in Equation 3 with the results of Equations 1 and 2, as follows:

$$166.66/(f_1'+f_2')=0.22866 \qquad \text{Equation 4}$$

$$(f_1'+f_2')=166.66/0.22866 \qquad \text{Equation 5}$$

$$(f_1'+f_2')=728.85 \text{ Hz} \qquad \text{Equation 6}$$

As described previously, the reference frequency $SUM_{REF}$ can correspond to a sum of the precession frequencies of the first and second gyromagnetic isotopes 16 and 18 in free inertial space in the presence of the magnetic field $B_Z$. Therefore, the reference frequency $SUM_{REF}$ corresponds to the frequency of 728.85 as demonstrated in Equation 6, such as counted down from the clock signal CLK. Additionally, the precession reference counter 58 can calculate a clock divisor for the reference frequency $SUM_{REF}$, as follows:

$$(6*10^6)/(f_1'+f_2')=(6*10^6)/728.85 \text{ Hz}=8232.1 \qquad \text{Equation 7}$$

Therefore, the clock divisor calculated in Equation 7 can be implemented to adjust a gyroscope drift rate for the clock 54, such as to render the signal ROT corresponding to the rotation of the NMR gyroscope system 10 about the sensitive axis to be substantially insensitive to clock drift (e.g., to first order).

In the example of FIG. 2, the detection system 50 also includes a phase-locked loop (PLL) component 60 that is configured to phase-lock the frequency signal SUM to the reference frequency $SUM_{REF}$. As described previously, the frequency signal SUM corresponds to the sum of the precession frequencies of the first and second gyromagnetic isotopes 16 and 18, which can remain constant in response to rotation of the NMR gyroscope system 10 about the sensitive axis (e.g., in a constant magnitude of the magnetic field $B_Z$) based on the counter-precession of the first and second gyromagnetic isotopes 16 and 18. Therefore, the phase-locking of the frequency signal SUM to the reference frequency $SUM_{REF}$ can likewise be insensitive to rotation of the NMR gyroscope system 10 about the sensitive axis. As an example, the PLL component 60 can be configured to multiply the frequency signal SUM by a cosine of the reference frequency $SUM_{REF}$. As a result, the PLL component 60 is demonstrated as generating a feedback signal B_FB. Referring back to the example of FIG. 1, the feedback signal B_FB is provided to the magnetic field generator 20 to control the magnitude of the magnetic field $B_Z$. Therefore, the magnetic field $B_Z$ can be maintained at a magnitude that can maintain the precession frequency of the first and second gyromagnetic isotopes 16 and 18, and thus the frequency signal SUM, substantially equal to the reference frequency $SUM_{REF}$.

Referring again to the example of FIG. 2, based on the phase-locking of the frequency signal SUM to the reference frequency $SUM_{REF}$, and based on the predetermined constant ratio of the precession frequencies of the first and second gyromagnetic isotopes 16 and 18, the precession frequency $f_1$ of the first gyromagnetic isotope 16 can be set equal to the frequency $f_1'$ generated by the precession reference counter 58. Therefore, the precession frequency $f_1$ is set equal to the frequency of the cyclical count value $I_1$ generated by the digital reference counter 56 that corresponds to the precession of the first gyromagnetic isotope 16 in free inertial space (e.g., in the magnetic field $B_Z$), as follows:

$$f_1/SUM=166.66/728.85=0.22866 \qquad \text{Equation 8}$$

$$f_1'/SUM_{REF}=166.66/728.85=0.22866 \qquad \text{Equation 9}$$

$$SUM=SUM_{REF}=(f_1+f_2)=(f_1'+f_2') \qquad \text{Equation 10}$$

$$f_1=f_1' \qquad \text{Equation 11}$$

As described previously, the cyclical count value $I_1$ can correspond to the precession of the first gyromagnetic isotope 16 in free inertial space (i.e., without a frequency component of the rotation of the NMR gyroscope system 10 about the sensitive axis). Similarly, the frequency signal $I_1R$ can correspond to the precession of the first gyromagnetic isotope 16 in the vapor cell 12 (i.e., including a frequency component of the rotation of the NMR gyroscope system 10 about the sensitive axis). Accordingly, a frequency difference between the cyclical count value $I_1$ and the frequency signal $I_1R$ can correspond to rotation of the NMR gyroscope system 10 about the sensitive axis.

The detection system 50 also includes an angle discriminator 62. The angle discriminator is configured to sample the frequency signal $I_1R$ that is provided from the demodulation system 52 at predetermined intervals. As described previously, the frequency signal $I_1R$ corresponds to the precession frequency of the first gyromagnetic isotope 16 plus the rotation of the NMR gyroscope system 10 about the sensitive axis. Therefore, in the absence of rotation of the NMR gyroscope system 10 about the sensitive axis, the period of the frequency signal $I_1R$ is synchronized with a period of the cyclical count value $I_1$ that is generated by the digital reference counter 56 (e.g., 36,000 counts). Accordingly, a difference in the period between the frequency signal $I_1R$ and the period of the cyclical count value $I_1$ corresponds to the frequency of the rotation of the NMR gyroscope system 10 about the sensitive axis. Therefore, the detection system 50 is configured to determine the rotation of the NMR gyroscope system 10 about the sensitive axis based on a difference of the number of counts of the cyclical count value $I_1$ in a given one sampling time to the next. As an example, the angle discriminator 62 can be configured to sample the frequency signal $I_1R$ at each period, and thus once for each period of the frequency signal $I_1R$, or at each zero crossing, and thus twice for each period of the frequency signal $I_1R$, such as to mitigate the effects of noise in the sampling of the frequency signal $I_1R$.

The detection system 50 further includes a synchronization latch 64, demonstrated in the example of FIG. 2 as SYNC LATCH, and a rotation latch 66. The synchronization latch 64 is configured to synchronize the period of the frequency signal $I_1R$ and the cyclical count value $I_1$ at initialization of the detection system 50. The angle discriminator 62 is configured to generate a trigger signal TRG upon a sampling time (e.g., zero-crossing) of the frequency signal $I_1R$. The trigger signal TRG is provided to both the synchronization latch 64 and the rotation latch 66. During initialization of the detection system 50, such as at a predetermined time during which there is no rotation of the NMR gyroscope system 10 about the sensitive axis, an initialization signal INIT can be provided to the synchronization latch 64. In response to the trigger signal TRG while the initialization signal INIT is asserted, the synchronization latch 64 can provide a reset signal RST to the digital reference counter 56 to reset the cyclical count value $I_1$. Therefore, upon initialization of the detection system 50, the cyclical count value $I_1$ can be synchronized with the period of the frequency signal $I_1R$ to allow detection of the rotation of the NMR gyroscope system 10 about the sensitive axis based on changes of the period of the frequency signal $I_1R$ relative to the cyclical count value $I_1$.

During operation of the NMR gyroscope system 10, subsequent to the initialization of the detection system 50, the trigger signal TRG can be provided to the rotation latch 66 to latch a value of the cyclical count value $I_1$. The latched value of the cyclical count value $I_1$ can be provided to a processor (not shown), such as via a bus, as the signal ROT corresponding to the rotation of the NMR gyroscope system 10 about the sensitive axis. For example, after initialization of the detection system 50, any non-zero value of the signal ROT can correspond to rotation of the NMR gyroscope system 10, such as based on the precision of the digital reference counter 56 (e.g., each increment being equal to 0.01° of rotation of the NMR gyroscope system 10 about the sensitive axis, as described previously). Thus, every time the trigger signal TRG is provided to the rotation latch 66 to capture the cyclical count value $I_1$, any change in the value of the captured cyclical count value ROT corresponds to additional rotation of the NMR gyroscope system 10 about the sensitive axis. The associated processor can thus calculate an angle of rotation, a rate of rotation, or any other inertial statistics of the NMR gyroscope system 10 based on the captured cyclical count value ROT.

The NMR gyroscope system 10 and the associated detection system 50 are therefore demonstrated herein as a manner of determining rotation about a sensitive axis based on the highly stable ratio of the precession of gyromagnetic isotopes in the presence of a magnetic field. As such, the NMR gyroscope system 10 can be implemented in a simple but highly accurate manner relative to typical gyroscope systems to calculate rotation about a sensitive axis. In addition, because the digital reference counter 56 and the precession reference counter 58 each operate from a common clock signal (e.g., clock signal CLK generated by the clock 54) to generate the cyclical count value $I_1$ and the reference frequency $SUM_{REF}$, respectively, to which the frequency signal $I_1R$ is set equal to based on the phase-locking of the signal SUM to the reference frequency $SUM_{REF}$, the detection system 50 can be substantially insensitive to clock drift (e.g., to first order). In addition, because the magnetic field $B_Z$ is controlled based on the phase-locking of the signal SUM to the reference frequency $SUM_{REF}$, the detection system 50 can likewise be substantially insensitive to magnetic field drift. Accordingly, the NMR gyroscope system 10 can be implemented to accurately determine rotation of the NMR gyroscope system 10 about a sensitive axis in a simplistic manner.

Figure 3:
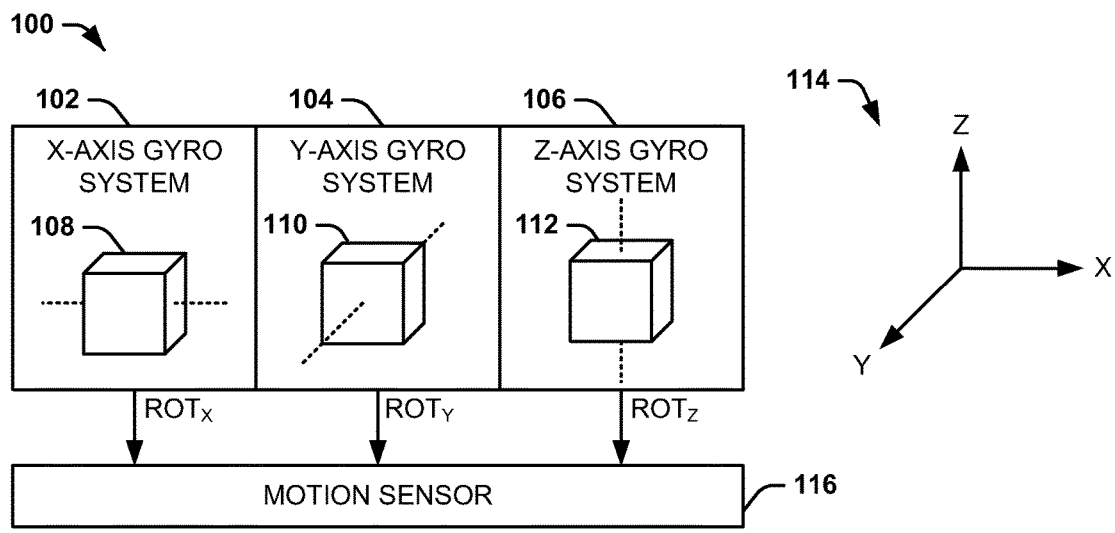
FIG. 3 illustrates an example of a three-axis gyroscope system.

FIG. 3 illustrates an example of a three-axis gyroscope system 100 in accordance with an aspect of the invention. As an example, the three-axis gyroscope system 100 can be implemented in any of a variety of navigation control systems, such as for aircraft and/or spacecraft, or device to monitor yaw, pitch, and roll rotational motion information.

The three-axis gyroscope system 100 includes an X-axis gyroscope system 102, a Y-axis gyroscope system 104, and a Z-axis gyroscope system 106. In the example of FIG. 3, the X-axis gyroscope system 102 can have a sensitive axis about the X-axis, the Y-axis gyroscope system 104 can have a sensitive axis about the Y-axis, and the Z-axis gyroscope system 106 can have a sensitive axis about the Z-axis. The axes of rotation of the respective NMR vapor cells 108, 110, and 112 are indicated in the example of FIG. 3 by a Cartesian coordinate system 114. As an example, each of the X-axis, Y-axis, and Z-axis gyroscope systems 102, 104, and 106 can be configured substantially similar to the NMR gyroscope system 10 in the example of FIG. 1. Thus, each of X-axis, Y-axis, and Z-axis gyroscope systems 102, 104, and 106 can be configured to determine respective rotation angles $ROT_X$, $ROT_Y$, and $ROT_Z$ about each of the respective X, Y, and Z axes based on respective detection beams $OPT_{DET}$ that are provided through each of the respective vapor cells 108, 110, and 112 and based on a predetermined constant ratio of precession frequencies of two gyromagnetic isotopes (e.g., $^{131}Xe$ and $^{129}Xe$). As an example, each of the X-axis, Y-axis, and Z-axis gyroscope systems 102, 104, and 106 can include a detection system configured substantially similar to the detection system 50 in the example of FIG. 2.

In the example of FIG. 3, each of the X-axis, Y-axis, and Z-axis gyroscope systems 102, 104, and 106 are demonstrated as outputting signals that include the respective rotation angles $ROT_X$, $ROT_Y$, and $ROT_Z$ to a motion sensor 116. The motion sensor 116 can thus be configured as a processor to determine an aggregate three-axis rotational motion of the associated vehicle or device that includes the three-axis gyroscope system 100. Therefore, the yaw, pitch, and roll of the associated vehicle or device that includes the three-axis gyroscope system 100 can be determined. Accordingly, the motion sensor 116 can be configured to display, output, and/or report the three-axis rotational motion of the associated vehicle or device that includes the three-axis gyroscope system 100.

Figure 4:
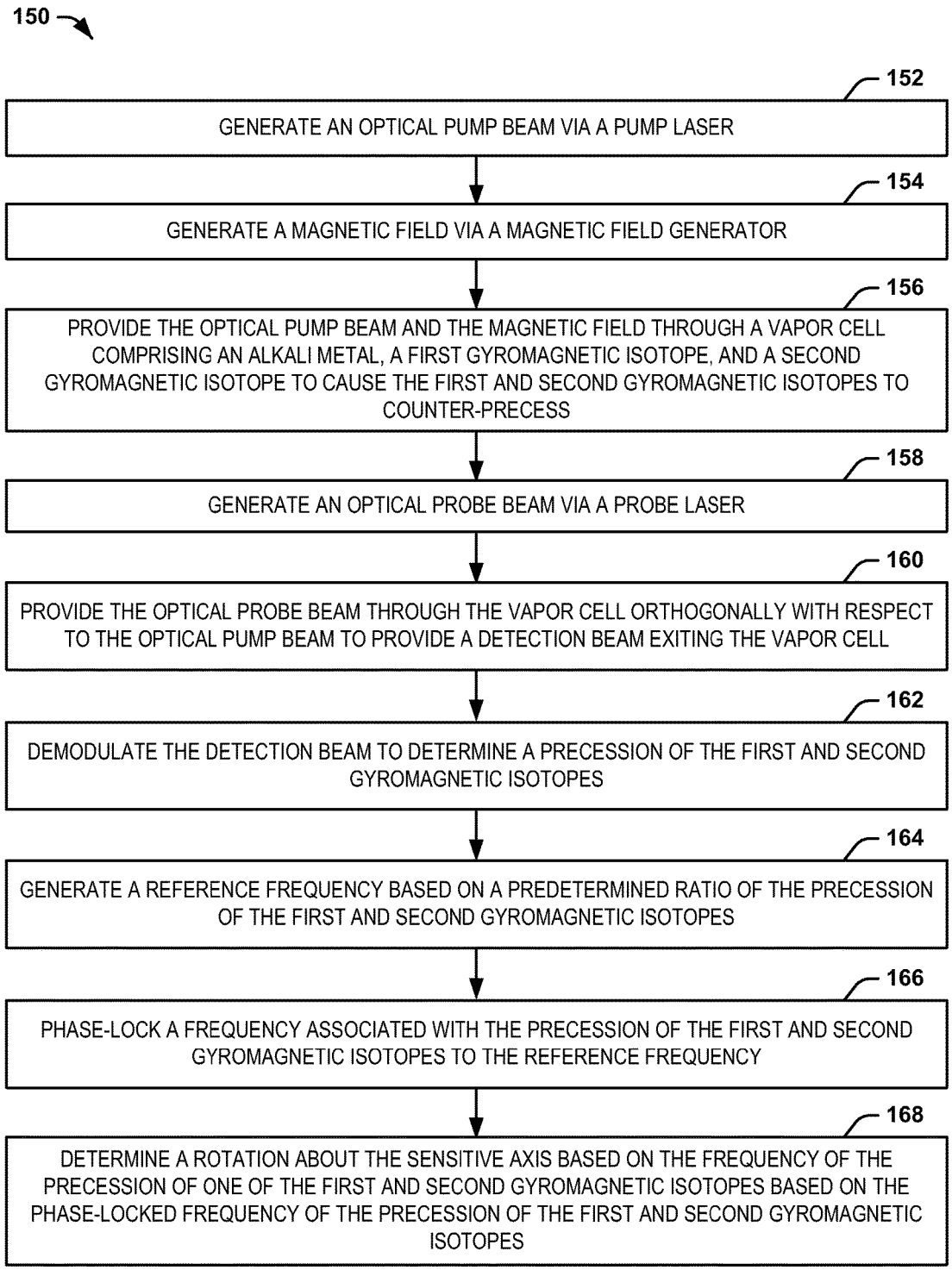
FIG. 4 illustrates an example of a method for measuring a rotation about a sensitive axis of an NMR gyroscope system.

In view of the foregoing structural and functional features described above, a methodology in accordance with various aspects of the present invention will be better appreciated with reference to FIG. 4. While, for purposes of simplicity of explanation, the methodology of FIG. 4 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 4 illustrates an example of a method 150 for measuring a rotation about a sensitive axis of an NMR gyroscope system (e.g., the NMR gyroscope system 10). At 152, an optical pump beam (e.g., the optical pump beam $OPT_{PMP}$) is generated via a pump laser (e.g., the pump laser 22). At 154, a magnetic field (e.g., the magnetic field $B_Z$) is generated via a magnetic field generator (e.g., the magnetic field generator 20). At 156, the optical pump beam and the magnetic field are provided through a vapor cell (e.g., the vapor cell 12) comprising an alkali metal (e.g., the alkali metal 14), a first gyromagnetic isotope (e.g., the first gyromagnetic isotope 16), and a second gyromagnetic isotope (e.g., the second gyromagnetic isotope 18) to cause the first and second gyromagnetic isotopes to counter-precess. At 158, an optical probe beam (e.g., the optical probe beam $OPT_{PRB}$) is generated via a probe laser (e.g., the probe laser 24). At 160, the optical probe beam is provided through the vapor cell orthogonally with respect to the optical pump beam to provide a detection beam (e.g., the detection beam $OPT_{DET}$) exiting the vapor cell. At 162, the detection beam is demodulated to determine a precession of the first and second gyromagnetic isotopes. At 164, a reference frequency (e.g., the reference frequency $SUM_{REF}$) is generated based on a predetermined ratio of the precession of the first and second gyromagnetic isotopes. At 166, a frequency (e.g., the frequency signal SUM) associated with the precession of the first and second gyromagnetic isotopes is phase-locked to the reference frequency. At 168, a rotation about the sensitive axis is determined based on the frequency of the precession of one of the first and second gyromagnetic isotopes based on the phase-locked frequency of the precession of the first and second gyromagnetic isotopes.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A nuclear magnetic resonance (NMR) gyroscope system comprising:
   a vapor cell comprising an alkali metal, a first gyromagnetic isotope, and a second gyromagnetic isotope;
   a pump laser configured to generate an optical pump beam;
   a magnetic field generator configured to generate a magnetic field that is substantially aligned with a sensitive axis to cause the first and second gyromagnetic isotopes to counter-precess based on the optical pump beam and the alkali metal;
   a probe laser configured to provide an optical probe beam through the vapor cell that exits the vapor cell as a detection beam; and
   a detection system configured to monitor the detection beam and to determine a rotation of the NMR gyroscope system about a sensitive axis based on a modulation of the detection beam in response to precession of the first and second gyromagnetic isotopes and based on a predetermined constant ratio of precession of the first and second gyromagnetic isotopes.

2. The system of claim 1, wherein the predetermined constant ratio of the precession of the first and second gyromagnetic isotopes is a ratio of a precession frequency of the first gyromagnetic isotope to a sum of precession frequencies of the first and second gyromagnetic isotopes, wherein the detection system is configured to generate a reference frequency that is based on the predetermined constant ratio of the precession of the first and second gyromagnetic isotopes.

3. The system of claim 2, wherein the detection system is configured to generate the reference frequency based on a digital reference counter having a frequency associated with a clock signal divided by the predetermined constant ratio of the precession of the first and second gyromagnetic isotopes, and is configured to phase-lock the precession of the first and second gyromagnetic isotopes to the reference frequency.

4. The system of claim 1, wherein the detection system comprises:
   a precession reference counter configured to generate a reference frequency based on a clock signal and based on the predetermined constant ratio of precession of the first and second gyromagnetic isotopes; and
   a phase-locked loop configured to phase-lock a sum of precession frequencies of the first and second gyromagnetic isotopes with the reference frequency.

5. The system of claim 4, wherein the phase-locked loop is configured to generate a magnetic field feedback signal based on the phase-locking of the sum of precession frequencies of the first and second gyromagnetic isotopes with the reference frequency, the magnetic field feedback signal being provided to the magnetic field feedback signal to adjust a magnitude of the magnetic field.

6. The system of claim 1, wherein the detection system comprises:
   a demodulation system configured to determine a first frequency corresponding to precession of the first gyromagnetic isotope in the vapor cell based on the magnetic field;
   a digital reference counter configured to generate a second frequency corresponding to precession of the first gyromagnetic isotope in free inertial space in the magnetic field based on a clock signal; and
   a rotation latch configured to determine the rotation of the NMR gyroscope system about the sensitive axis based on a difference between the first frequency and the second frequency.

7. The system of claim 6, wherein the second frequency is different from the first frequency by a third frequency corresponding to the rotation of the NMR gyroscope system about the sensitive axis based on a phase-locking associated with a reference frequency corresponding to the counter-precession of the first and second gyromagnetic isotopes and the predetermined constant ratio of precession of the first and second gyromagnetic isotopes.

8. The system of claim 6, wherein the digital reference counter is configured to provide the second frequency as a counter value, wherein the detection system further comprises an angle discriminator configured to sample the second frequency at each of predetermined sample times associated with the first frequency and to provide a trigger signal to the latch at each of the predetermined sample times, the latch being configured to capture the counter value in response to the trigger signal, wherein a difference in a number of counts of the counter value based on the captured counter value at each of consecutive predetermined sample times corresponds to rotation of the NMR gyroscope system about the sensitive axis.

9. The system of claim 8, wherein the detection system is configured to synchronize the counter value with the period of the first frequency at a predetermined sample time in response to an initialization signal.

10. A three-axis NMR gyroscope system comprising a plurality of the NMR gyroscope system of claim 1 configured to determine rotation of the three-axis NMR gyroscope system about each of three orthogonal sensitive axes.

11. A method for measuring a rotation about a sensitive axis of a nuclear magnetic resonance (NMR) gyroscope system, the method comprising:
  generating an optical pump beam via a pump laser;
  generating a magnetic field via a magnetic field generator;
  providing the optical pump beam and the magnetic field through a vapor cell comprising an alkali metal, a first gyromagnetic isotope, and a second gyromagnetic isotope to cause the first and second gyromagnetic isotopes to counter-precess;
  generating an optical probe beam via a probe laser;
  providing the optical probe beam through the vapor cell orthogonally with respect to the optical pump beam to provide a detection beam exiting the vapor cell;
  demodulating the detection beam to determine a precession of the first and second gyromagnetic isotopes;
  generating a reference frequency based on a predetermined ratio of the precession of the first and second gyromagnetic isotopes;
  phase-locking a frequency associated with the precession of the first and second gyromagnetic isotopes to the reference frequency; and
  determining a rotation about the sensitive axis based on the frequency of the precession of one of the first and second gyromagnetic isotopes based on the phase-locked frequency of the precession of the first and second gyromagnetic isotopes.

12. The method of claim 11, wherein generating the reference frequency comprises generating the reference frequency based on a counter frequency associated with a clock signal divided by the predetermined constant ratio of the precession of the first and second gyromagnetic isotopes.

13. The method of claim 12, wherein phase-locking the frequency associated with the precession of the first and second gyromagnetic isotopes comprises phase-locking a sum of the frequencies of the precession of the first and second gyromagnetic isotopes with the reference frequency.

14. The method of claim 11, further comprising:
  generating a magnetic field feedback signal based on the phase-locking of the frequency associated with the precession of the first and second gyromagnetic isotopes to the reference frequency; and
  adjusting a magnitude of the magnetic field based on the magnetic field feedback signal.

15. The method of claim 11, wherein demodulating the detection beam comprises determining a first frequency corresponding to the precession of the first gyromagnetic isotope in the vapor cell based on the magnetic field, the method further comprising:
  generating a second frequency corresponding to the precession of the first gyromagnetic isotope in free inertial space in the magnetic field based on a clock signal; and
  determining the rotation of the NMR gyroscope system about the sensitive axis based on a difference between the first frequency and the second frequency.

16. The method of claim 15, wherein determining the rotation of the NMR gyroscope system comprises:
  providing the second frequency as a counter value;
  generating a trigger signal at each of predetermined sample times associated with the first frequency; and
  latching the second counter value in response to the trigger signal, wherein determining the rotation of the NMR gyroscope system about the sensitive axis comprises comparing the latched second counter value with an immediately preceding latched second counter value.

17. A nuclear magnetic resonance (NMR) gyroscope system comprising:
  a vapor cell comprising an alkali metal, a first gyromagnetic isotope, and a second gyromagnetic isotope;
  a pump laser configured to generate an optical pump beam;
  a magnetic field generator configured to generate a magnetic field that is substantially aligned with a sensitive axis to cause the first and second gyromagnetic isotopes to counter-precess based on the optical pump beam and the alkali metal;
  a probe laser configured to provide an optical probe beam through the vapor cell that exits the vapor cell as a detection beam; and
  a detection system comprising:
    a demodulation system configured to receive the detection beam and to determine a frequency corresponding to precession of the first gyromagnetic isotope in the vapor cell based on the magnetic field;
    a precession reference counter configured to generate a reference frequency based on a clock signal and based on a predetermined constant ratio of precession of the first and second gyromagnetic isotopes;
    a phase-locked loop configured to phase-lock a sum of precession frequencies of the first and second gyromagnetic isotopes with the reference frequency; and
    a rotation latch configured to determine a rotation of the NMR gyroscope system about the sensitive axis based on the frequency corresponding to precession of the first gyromagnetic isotope.

18. The system of claim 17, wherein the precession reference counter is configured to generate the reference frequency based on a counter frequency associated with the clock signal divided by the predetermined constant ratio of the precession of the first and second gyromagnetic isotopes.

19. The system of claim 17, wherein the phase-locked loop is configured to generate a magnetic field feedback signal based on the phase-locking of the sum of precession frequencies of the first and second gyromagnetic isotopes with the reference frequency, the magnetic field feedback signal being provided to the magnetic field feedback signal to adjust a magnitude of the magnetic field.

20. The system of claim 17, wherein the frequency corresponding to precession of the first gyromagnetic isotope in the vapor cell is a first frequency, wherein the detection system further comprises a digital reference counter configured to generate a second frequency corresponding to precession of the first gyromagnetic isotope in free inertial space in the magnetic field based on a clock signal, wherein the second frequency is different from the first frequency by a third frequency corresponding to the rotation of the NMR gyroscope system about the sensitive axis based on the phase-locking of the sum of precession frequencies of the first and second gyromagnetic isotopes with the reference frequency, wherein the rotation latch is configured to latch a counter value of the digital reference counter that corresponds to a difference between the first frequency and the second frequency, and thus the rotation of the NMR gyroscope system about the sensitive axis.

* * * * *